PERMEABILITY TUNER

Filed Dec. 8, 1950 2 SHEETS--SHEET 1

INVENTORS
Gustave Shapiro and
Robert O. Stone
By
Attorneys

Feb. 26, 1952 G. SHAPIRO ET AL 2,586,870

PERMEABILITY TUNER

Filed Dec. 8, 1950 2 SHEETS—SHEET 2

INVENTORS
Gustave Shapiro and
Robert O. Stone
By
Walter S. Paul
Attorneys

Patented Feb. 26, 1952 2,586,870

UNITED STATES PATENT OFFICE 2,586,870

PERMEABILITY TUNER

Gustave Shapiro, Washington, D. C., and
Robert O. Stone, Dickerson, Md.

Application December 8, 1950, Serial No. 199,902

9 Claims. (Cl. 74—10.85)

(Granted under the act of March 3, 1883, as amended April 30, 1928; 370 O. G. 757)

This invention relates to tuning apparatus, and more particularly to permeability tuning apparatus for providing linear tuning characteristics.

Prior art devices are characterized by a number of limitations and disadvantages. In some devices, when linear control is required, the inductors are wound in a non-linear manner; e. g., in the case of high-inductance windings, where a large number of turns are required with several layers of winding at one end of the coil, perhaps a single layer near the central portion, and a few layers at the other end. Such coils are usually "progressive universal wound," with a variable build-up. In addition, the usual manufacturing methods do not produce tuning slugs with completely uniform characteristics. Thus, not only manufacture, but also quality control, is extremely difficult.

Further disadvantages of the old apparatus are the waste space and the larger inductor assembly which result from this type of winding, as compared with a uniformly wound inductor which provides identical maximum inductance.

The apparatus of the instant invention overcomes these disadvantages and limitations, and utilizes small, easily manufactured, uniformly wound inductances, the straight line frequency characteristic being obtained through the use of a non-linear drive screw. Provision is made for tracking the oscillator tuned circuit of a superheterodyne receiver with the signal circuits by using slugs of differing permeabilities driven at identical rates, or by driving identical oscillator and signal circuit slugs at other than identical rates. Further provision is made for individual alignment of each inductor to compensate for variations in manufacture and assembly.

Accordingly, it is a primary object of the invention to provide new and improved tuning apparatus.

Another object is to provide new and improved permeability tuning apparatus having a linear frequency characteristic.

Still another object is to provide new and improved permeability tuning apparatus having means for individual alignment of each of several inductors.

Other objects and advantages will become apparent after a consideration of the following specification when taken in connection with the accompanying drawings, in which.

Figure 1:
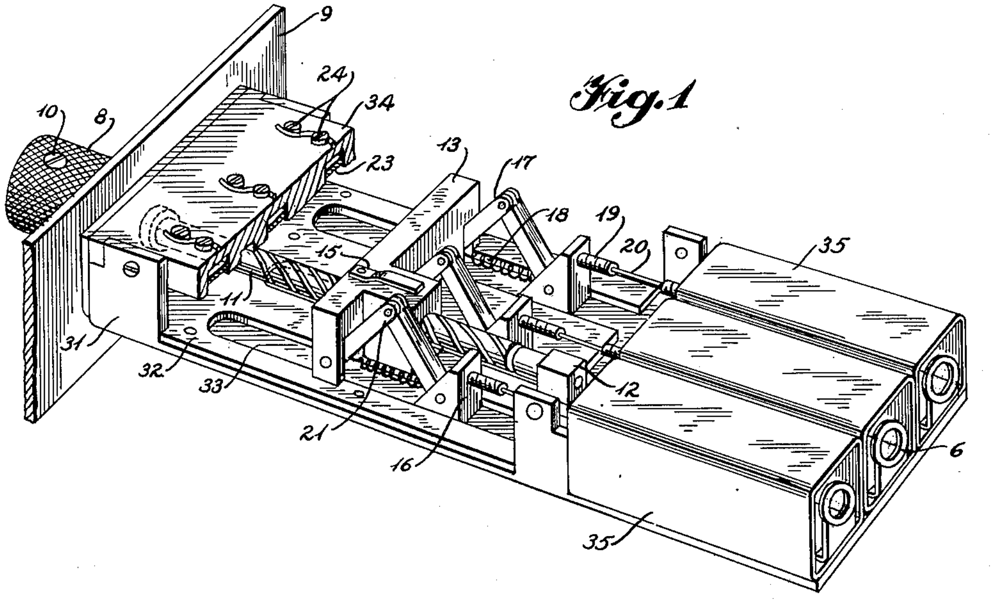
Fig. 1 is a perspective view of a tuner embodying the instant invention with the cover plate broken away to show the mechanism underneath more clearly.

Referring now to the drawings, in which like reference characters are used throughout to designate like parts, and more particularly to Fig. 1 thereof, for a more complete understanding of the invention, there is shown a base plate 31, on which is fixedly mounted, by any suitable means, a slotted plate 32, provided with grooves 33, and a cover plate or cover member 34. A plurality of uniformly wound shielded coil assemblies 35 are fixed at one end of base plate 31; these coil assemblies have mounted on their outward ends the tuning capacitors 6, which may be washer-shaped, and which are so connected as to form resonant circuits in conjunction with said coils.

Figure 2:
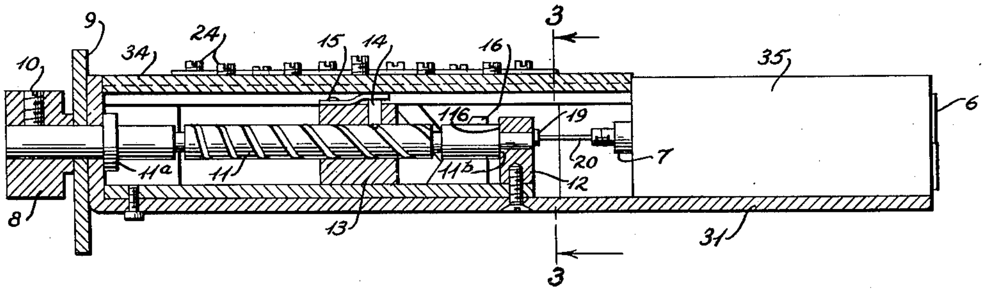
Fig. 2 is a longitudinal cross-sectional view of the tuner of Fig. 1, taken along the line 2—2 of Fig. 3.

Mounted in each of the coils is a slug 7, Fig. 2, the longitudinal motion of which provides for tuning the coil. A control knob 8 is provided on the front of a panel 9, being affixed by set screw 10 or other suitable means to the shank portion of non-linear screw 11, the other end of which is journalled in a block 12, as shown. The non-linear screw 11 passes through a hole in drive plate 13; normal to this hole is a second hole designed to accommodate a pin 14 which is pressed by spring 15 to engage the thread of non-linear screw 11. Thus, when screw 11 is turned, plate 13, which is restrained from rotation, will travel along the screw, its rate of longitudinal travel per revolution being determined by the pitch of the screw at a given position of the sliding plate member. Preferably the engaging end of the pin is trapezoidal in shape to eliminate the backlash.

Figure 4:
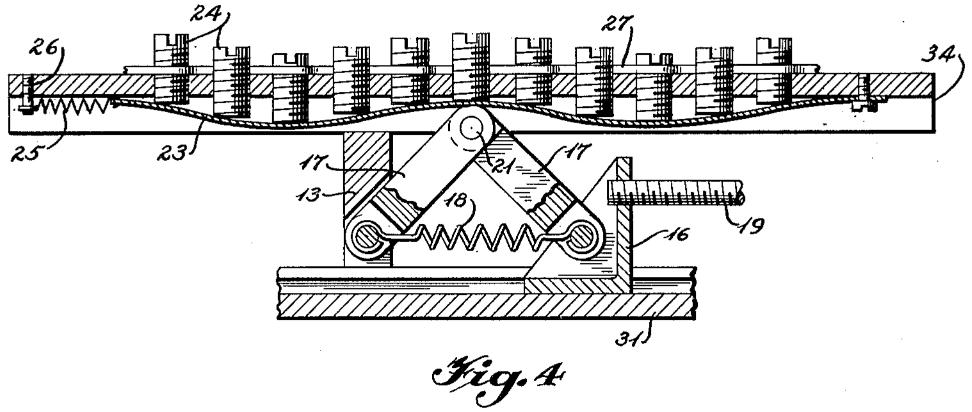
Fig. 4 is a detailed view of a suitable alignment device.

Motion of plate 13 is transmitted to drive blocks 16, through linkage arms 17 shown in detail in Fig. 4, which are kept under substantially constant tension by springs 18. Adjustment screws 19, provided for rough adjustment, are turned into blocks 16, and carry flexible members 20, Figs. 1 and 2, which are affixed to slugs 7.

The linkage arms 17 are pivoted to plate 13 and blocks 16, and are pivotally linked together in pairs at knees 21, as shown.

Particular reference is made now to Fig. 2 for a clearer understanding of the relationship of screw 11 and drive plate 13. It is observed that screw 11 is restrained from longitudinal motion by the action of shoulder 11a acting upon the upturned end of plate 31, and shoulder 11b acting upon block 12 in which the remote end of screw 11 is journalled.

Figure 3:
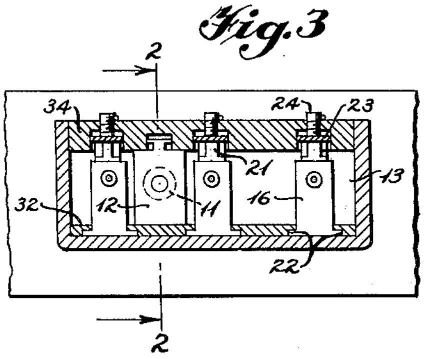
Fig. 3 is a transverse cross-sectional view of the tuner of Fig. 1, taken along the line 3—3 of Fig. 2.

Referring particularly now to Fig. 3, plate 13 is observed to be restrained from rotation by its fit between base plate 32 and top plate 34. Similarly, blocks 16 are prevented from twisting and rocking by being made in a modified T-shape in cross-section, the cross arm of the inverted T fitting slots 22 in plate 32.

Particular reference is made now to Fig. 4 for a more complete understanding of the manner in which an aforementioned cam operates as an adjustable vernier to provide a continuously adjustable trimmer. Spring 18, connected between linkage arms 17, tends to cause knee 21 to flex, the degree of flexure being controlled by the position of knee 21 in relation to base plate 31, as governed by cam 23, and said flexure controls the distance between plate 13 and block 16. The curvature of cam 23 is regulatable by means of set screws 24, said cam being fixed to plate 34 at one end, and may be under spring tension, through spring 25 affixed to stud 26, at the other end. If desired, spring 25 may be omitted. Set screws 24 are restrained from motion under vibration, but are permitted to turn under screw driver pressure, by a frictional device, such, for example, as a length of piano wire 27, interwoven between them.

Assuming, for purposes of explanation, that plate 13 is being moved to the right, Fig. 4, at a uniform rate, it is noted that non-uniform motion will be imparted to block 16, for as the knee 21 passes beneath a depressed portion of the cam 23, said knee will be caused to unflex, and thus the motions of block 16 will be greater than formerly.

If desired, where a small degree of non-linearity must be compensated for in the tuned inductors, e. g., when only a small part of the possible tuning ratio of the variable inductors is required, the required compensation may be obtained with the variable cam mechanism alone thereby eliminating the variable pitch series and variable pitch screw.

Figure 5:
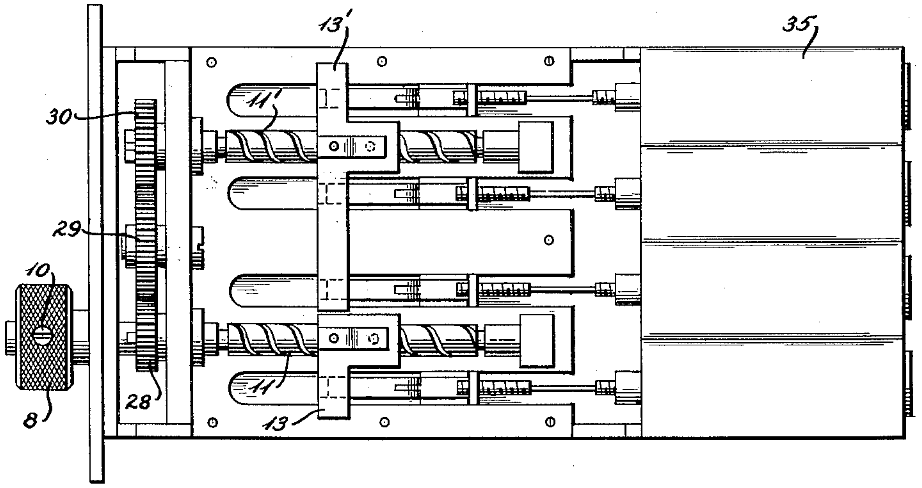
Fig. 5 is an elevational view of a modification of the tuner of Fig. 1.

Particular reference is made now to Fig. 5, in which is shown a modified form of apparatus embodying the invention. Two substantially identical screws 11 and 11′ are employed for driving blocks 13 and 13′ respectively. Screw 11 has mounted thereon to rotate therewith a gear 28, which meshes with an idler 29 mounted as shown, the idler in turn meshing with a driven gear 30 mounted on screw 11′ to rotate therewith. Thus, when knob 8 is turned, screw 11 will turn at the same rate, being directly coupled to the aforementioned knob, but screw 11′ will turn at a rate determined by the ratio of gear 28 to gear 30, rotation of the two screws being in the same direction through the action of idler 29.

If desired, the characteristics of the slugs can be varied to permit their use in tuning in which oscillator circuit and signal-circuit slugs are driven at identical rates, as is well known in the art. For example, different quantities of material may be used in the slugs of the different circuits. The different slugs of required size may conveniently be produced by producing two identical slugs, and then removing the desired quantity of material from one slug by cutting a longitudinal slot in it, or by shaving it longitudinally.

If desired, in some applications, the non-linear screw may be dispensed with and linearization achieved with the cam surface alone.

Obviously many modifications and variations of the present invention are possible in the light of the above teachings. It is therefore to be understood that within the scope of the appended claims the invention may be practiced otherwise than as specifically described.

This invention may be manufactured and used by or for the Government of the United States of America for governmental purposes without the payment of any royalties thereon or therefor.

What is claimed as new and desired to be secured by Letters Patent of the United States is:

1. Tuning apparatus comprising, in combination, an inductor, movable slug means associated with said inductor for varying the inductance thereof in accordance with the position of said slug means, manually turnable screw means having a non-linear groove therein, a support member having an aperture therein and slidably mounted on said screw means, said member having pin means engaging said groove for positioning said member along the longitudinal axis of said screw means as said screw means is turned, a first arm pivotally connected at one end thereof to said member, a second arm pivotally connected to the other end of said first arm, spring means normally urging the opposite ends of said arms into adjacent positions, means associated with said arms for varying the angle between said arms as the member is moved, and means operatively connecting said second arm to said slug means.

2. Tuning apparatus comprising an inductor, movable slug means associated with said inductor for varying the inductance thereof in accordance with the position of said slug means, manually turnable screw means having a non-linear groove therein, a support member having an aperture therein and slidably mounted on said screw means, said member being restrained from angular motion about the longitudinal axis of said screw means, said member having pin means engaging said groove for positioning said member along the longitudinal axis of said screw means as said screw means is turned, means of adjustable length connecting said slug means to said member for positioning the slug means and tuning said inductor, a cam member disposed in predetermined position with respect to said means of adjustable length for varying the length thereof, and adjustable means associated with said cam member for varying the contour thereof.

3. Apparatus according to claim 2 wherein said adjustable means associated with said cam member for varying the contour thereof comprises a plurality of adjustable set screws positioned along the length of said cam member.

4. Tuning apparatus comprising first and second inductors, first and second slug means associated with said first and second inductors respectively for varying the inductances thereof in accordance with the positions of said slug means respectively, first and second screw means having non-linear grooves therein, first and second support members having apertures therein and slidably mounted on said screw means respectively, both said support members having pin means engaging said grooves for positioning said members along the longitudinal axes of said screw means as said screw means are turned, manually adjustable means, gear means operated from said manually adjustable means and connected to said first and second screw means for rotating said first and second screw means simultaneously in the same direction and at a speed ratio predetermined by said gear means, and first and second means connecting said first and second support members to said first and second slug means respectively.

5. Apparatus according to claim 4 wherein each of said first and second means connecting said support members to said slug means is adjustable in length.

6. Apparatus according to claim 5 including in addition means associated with said connecting means for varying the lengths thereof.

7. Apparatus according to claim 6 wherein said means associated with said connecting means for varying the lengths thereof comprises first and second cam members disposed in predetermined positions with respect to said first and second connecting means respectively.

8. Apparatus according to claim 7 including in addition means for varying the contours of the cam members.

9. Apparatus according to claim 8 wherein said means for varying the contours of the cam members comprises a plurality of adjustable set screws positioned along the lengths of the cam members.

GUSTAVE SHAPIRO.
ROBERT O. STONE.

REFERENCES CITED

The following references are of record in the file of this patent:

UNITED STATES PATENTS

| Number | Name | Date |
|---|---|---|
| 2,478,287 | Laschenski | Aug. 9, 1949 |
| 2,485,464 | Stott | Oct. 18, 1949 |

FOREIGN PATENTS

| Number | Country | Date |
|---|---|---|
| 201,925 | Germany | Sept. 23, 1908 |
| 526,586 | France | July 5, 1921 |